(12) United States Patent
Sugimura

(10) Patent No.: US 6,382,902 B1
(45) Date of Patent: May 7, 2002

(54) METHOD FOR CONTROLLING HANDLING ROBOT

(75) Inventor: Shunsuke Sugimura, Kanagawa (JP)

(73) Assignee: Komatsu, LTD, Tokyo (JP)

( * ) Notice: Subject to any disclaimer, the term of this patent is extended or adjusted under 35 U.S.C. 154(b) by 0 days.

(21) Appl. No.: 09/402,397

(22) PCT Filed: Apr. 3, 1998

(86) PCT No.: PCT/JP98/01555

§ 371 Date: Oct. 5, 1999

§ 102(e) Date: Oct. 5, 1999

(87) PCT Pub. No.: WO98/45095

PCT Pub. Date: Oct. 15, 1998

(30) Foreign Application Priority Data

Apr. 8, 1997 (JP) ............................................. 9-089501

(51) Int. Cl.[7] .................................................. B25J 9/06
(52) U.S. Cl. ...................... 414/805; 414/939; 414/217; 414/937; 414/941; 414/744.5; 414/744.6; 414/416.03; 118/719
(58) Field of Search .......................... 414/744.4, 744.5, 414/217, 217.1, 806, 805, 744.6, 800, 804, 941, 937, 939, 935, 416.03, 416.08; 118/719

(56) References Cited

U.S. PATENT DOCUMENTS

| | | | | |
|---|---|---|---|---|
| 5,042,774 A | * | 8/1991 | Kakinuma | ........... 414/744.5 X |
| 5,584,647 A | * | 12/1996 | Uehara et al. | ........... 414/744.5 |
| 5,857,826 A | * | 1/1999 | Sato et al. | ................ 414/744.6 |
| 5,934,856 A | * | 8/1999 | Asakawa et al. | ..... 414/744.6 X |
| 6,102,164 A | * | 8/2000 | McClintock et al. | 414/744.5 X |
| 6,155,768 A | * | 12/2000 | Bacchi et al. | ........ 414/744.5 X |

FOREIGN PATENT DOCUMENTS

| | | |
|---|---|---|
| JP | 61-136105 | 6/1986 |
| JP | 8-71965 | 3/1996 |
| WO | WO 95/14555 | 6/1995 |
| WO | WO97/34742 | 9/1997 |
| WO | WO 97/35690 | 10/1997 |

* cited by examiner

*Primary Examiner*—Frank E. Werner
(74) *Attorney, Agent, or Firm*—Armstrong, Westerman & Hattori, LLP

(57) ABSTRACT

A handling robot control method is disclosed for a handling robot disposed in a transfer chamber (1) having a plurality of process chamber stations (2e) arranged around it in communication therewith via respective gates (6), the robot having a first and a second carrier tables (8a, 8b) that are deviated in turning angular position from one to the other about a center of turning, the robot performing an operation to move the first and second carrier tables to turn jointly in the transfer chamber and also an operation to move the first and second carrier tables individually either to project through a said gate into a said process chamber station or to retract into the transfer chamber. The method comprises: overlapping the operation to move the carrier tables to project and to retract with the operation to move the first and second carrier tables to turn jointly.

4 Claims, 19 Drawing Sheets

METHOD FOR CONTROLLING HANDLING ROBOT

TECHNICAL FIELD

The present invention relates to a handling robot control method for use in a multiple chamber type manufacturing system such as for making semiconductors and LCDs in which a plurality of process chambers designed to constitute individual stations or stages are arranged around a single transfer chamber, and a workpiece in the form of a sheet or a thin plate such as a wafer to be worked on and processed in each of the process chambers is transferred by a handling robot from one of the process chambers to another via the transfer chamber.

BACKGROUND ART

A multiple chamber type semiconductor manufacturing system constructed as shown in FIG. 1 includes a transfer chamber 1 around which a plurality of process chambers stations 2a, 2b, 2c, 2d, 2e, each comprising a process chamber, and for delivering a workpiece to the outside section of the system workpiece delivery stations 3 are arranged. The inside of the transfer chamber 1 is normally held in vacuum by suitable vacuum equipment.

The transfer chamber 1 is constructed as shown in FIG. 2, having a handling robot A disposed turnably in its central region. Constituting its peripheral wall as a whole, partition walls 5 that are opposed to the process chamber stations 2a, 2b, 2c, 2d, 2e and the workpiece delivering stations 3 are formed with gates 6, respectively, each of which provides an inlet and outlet for a workpiece into and out of each process chamber station. These gates 6 so they may be opened and closed are provided with their respective opening/closing doors (not shown) arranged in opposition thereto, respectively, inside the transfer chamber 2.

For the handling robot A use is typically made of a robot of double arm type, so called "frog leg" type, which is constructed as shown in FIGS. 3 through FIGS. 6A and 6B.

As shown, a boss portion B of the handling robot A has a pair of arms 7a and 7b of an identical length each of which is turnable about a center of rotation. It also has a pair of carrier tables 8a and 8b of an identical form, disposed at the opposite sides of the center of rotation or turning. The carrier tables 8a and 8b have their respective bases to each of which respective one ends of a pair of links 9a and 9b having an identical length are connected. The respective one ends of the two links 9a and 9b are connected to each of the two carrier tables 8a and 8b through a frog leg type carrier table posture control mechanism so that the two links may turn completely symmetrically and in opposite directions with respect to each of the carrier tables 8a and 8b. And, one of the two links 9a connected to the carrier tables 8a and 8b is connected to one of the arms 7a while the other link 9b is connected to the other arm 7b.

FIGS. 4A and 4B show different forms of the frog leg type carrier table posture control mechanism mentioned above. Thus, the respective one ends of the two links 9a and 9b may be connected to each of the carrier tables 8a and 8b through a gear structure comprising a pair of gears 9c and 9c in mesh with each other so that the respective angles of posture θR and θL of the links 9a and 9b with respect to each of the carrier tables 8a and 8b may always be held identical to each other. This permits each of the carrier tables 8a and 8b to be oriented and to be operated in a radial direction of the transfer chamber 1. For the links 9a and 9b to be connected to the carrier tables 8a and 8b, in lieu of the gears a crossed belting arrangement 9d may be employed as shown in FIG. 4B.

FIG. 5 shows a conventional mechanism for moving the arms 7a and 7b to turn independently of each other. The bases of the arms 7a and 7b are each in the form of a ring and are constituted with ring bosses 10a and 10b, respectively, which are positioned coaxially about the center of rotation or turning and supported turnably with respect to the transfer chamber 1.

Inside of each of the ring bosses 10a and 10b, there is arranged a disk boss 11a, 11b coaxially therewith and opposed thereto, respectively. Each pair of the ring boss and the disk boss 10a and 11a, 10b and 11b that are opposed to each other are magnetically coupled together with a magnetic coupling 12a, 12b in the rotary direction.

The rotary shafts 13a and 13b of the disk bosses 11a and 11b are arranged coaxially with each other and are connected to the output sections of the motor units 14a and 14b, respectively, which are in turn supported coaxially with each other and axially deviated in position from one to the other on a frame 1a of the transfer chamber 1.

The motor units 14a and 14b may each be an integral combination of an AC servo motor 15 and a reducer 16 using a harmonic drive (a trade name, the representation which will be repeated hereafter) and having a large reduction ratio in which the output sections of the reducers 16 and 16 are connected to the base ends of the rotary shafts 13a and 13b, respectively. Because the transfer chamber 1 in which the arms 7a and 7b are positioned is to be maintained in a vacuum state, sealing partition walls 17 are provided each between the ring boss 10a and the disk boss 11a and between the ring boss 10b and the disk boss 11b.

FIGS. 6A and 6B are used to describe an operation of the conventional handling robot A. When the two arms 7a and 7b lie at diametrically opposed, symmetrical positions about the center of rotation as shown in FIG. 6A, the two links 9a and 9b will each have had turned to have its two legs opened at maximum with respect to the carrier tables 8a and 8b. The two carrier tables 8a and 8b will then have been moved towards the center of rotation or turning.

In this state, turning the two arms 7a and 7b in a given direction will cause the two carrier tables 8a and 8b to turn jointly about the center of rotation while maintaining their radial positions. Conversely, turning the two arms 7a and 7b from the state shown in FIG. 6A in opposite directions such as to have them approach each other will cause the one carrier table 8a of the position where the angle made with the arms 7a and 7b is decreasing to be pushed by the links 9a and 9b to move to project radially outwards and thus to be plunged or forced to project into the process chamber of the one of stations 2a, 2b, 2c, 2d and 2e that is adjacent thereto radially outside of the transfer chamber 1 as shown in FIG. 6B.

In this case, while the other carrier table is moved towards the center of rotation or turning, the distance of this movement will be small because of the angles that the arms 7a and 7b are making with the links 9a and 9b.

While a conventional handling robot A as described having two carrier tables permits them to be used alternately or successively and is expected to achieve an operation and effects of a double arm robot, in reality it has problems as mentioned below.

Specifically, a sequence of processes is predetermined. Feeding a wafer processed in each process chamber station sequentially into each next station permits a wafer that is being or has been processed to remain in each such station. If, then, a processed wafer in a certain station is to be exchanged with an unprocessed wafer, as shown in FIGS. 7 through 11 it is the common practice with the conventional handling robot A first to support the processed wafer W1 on one carrier table 8a, and then to turn the handling robot A to oppose the vacant carrier table 8b (FIG. 7) to a station 2e where the wafer is being exchanged.

Then, the vacant carrier table 8b is forced to move into the station 2e to accept the processed wafer W2 thereon (FIG. 8) and to be conveyed into the transfer chamber 1. Thereafter, the handling robot A is turned by 180 degrees (FIG. 9) to permit the carrier table 8a carrying the unprocessed wafer W1 to be opposed to the station 2e and then to be forced to move into the station 2e (FIG. 10). The unprocessed wafer W1 is thus conveyed into the station 2e while the carrier table that became vacant 8a is retracted into the transfer chamber 1 (FIG. 11).

In this way, each time wafers are exchanged, the handling robot has had to be turned by 180 and as a result has had the problem that it entails a relatively long cycle time for the wafer exchanging operation.

As described in International Patent Application published as WO 97/35690 and filed by the present applicant, there are a second and a third type of handling robots A' and A" that can be turned by an angle as small as 45 degrees to enable a processed wafer in a station and an unprocessed wafer in the transfer chamber to be exchanged with each other, thus being capable of shortening the cycle time for a wafer exchange operation.

The second type of handling robot A' referred to above is depicted in FIGS. 12 through 14. Thus, centrally of the transfer chamber 1, the handling robot A' has two ring bosses, a first and a second 20a and 20b that are disposed coaxially with each other and lie one above the other in their axial direction. The first and second ring bosses 20a and 20b are supported with bearings (not shown) so as to be each individually rotatable. Each of the ring bosses 20a and 20b has in its inside a disk boss 21a, 21b juxtaposed therewith, respectively, which lie one above the other in their axial direction. The disk bosses 21a and 21b are supported through bearings (not shown) so as to be each individually rotatable on the frame of the transfer chamber 1.

Each pair of the ring boss 20a and the disk boss 21a, the ring boss 20b and the disk boss 21b are magnetically coupled together by a magnetic coupling 22a, 22b in their respective rotary directions. A sealing partition wall 23 is provided between the ring bosses 20a, 20b and the disk bosses 21a, 21b so that the transfer chamber 1 is maintained in a vacuum state.

The disk bosses 21a and 21b have at their respective axial center portions their respective rotary shafts 24a and 24b disposed coaxially with each other. Of these two rotary shafts, the first rotary shaft 24a is hollow into which the second rotary shaft 24b is inserted to rest therein. The first and second rotary shafts 24a and 24b are connected each via a coupling mechanism such a timing belt to the output shafts 26a and 26b of a first and a second motor unit 25a and 25b, respectively.

For each of the motor units 25a and 25b, use may be made of either a combination of a servo motor and a reducer or a motor alone. It is important that each of the output shafts. 26a, 26b of the motor units 25a and 25b have an output reduced at a very large redaction ratio and controlled as to the direction of rotation, i.e., normal rotation or reverse rotation. It is also important that a speed ration of the coupling mechanism for connecting the output shaft 26a to the rotary shaft 24a and a speed ratio of the coupling mechanism for coupling the output shaft 26b to the rotary shaft 24b are identical to each other.

The first ring boss 20a has on side surfaces thereof a first and a second arm 27a and 27b projecting radially outwards thereof. The second ring boss 20b has on a side surface thereof a third arm 27c projecting radially outwards thereof. A leg column 27e is mounted on a top surface of the second ring boss 20b and has on its top a fourth arm 27d extending radially outwards thereof. These arms have their respective tuning fulcrums on the upper surfaces of their respective ends.

These arms 27a, 27b, 27c and 27d have an identical turning radius A for their respective turning fulcrums. The first and fourth arms 27a and 27d have their respective turning fulcrums that are positioned vertically identically to each other. The second and third arms 27b and 27c have their respective turning fulcrums that are positioned vertically identically to each other on a plane which lies below those of the first and fourth arms 27a and 27d.

Turnably connected to the respective ends of the arms 27a, 27b, 27c and 27d on their respective turning fulcrums are ends of a first, a second, a third and a fourth link 28a, 28b, 28c and 28d, respectively, each of which has a length greater than the length R of each of the arms. And, the first and fourth links 28a and 28d have the first carrier table 8a connected thereto via a frog leg type carrier table position control mechanism on their end lower surfaces. Also, the second and third links 28b and 28c have the second carrier table 8b connected thereto via such a frog leg type carrier table position control mechanism on their end upper surfaces.

Then, the first carrier table 8a lies to assume a so called standby state thereof where both the first and fourth arms 27a and 27d are aligned in their diametric directions. Likewise, the second carrier table 8b is also assuming a standby state thereof when the second and third arms are aligned in their diametric directions. And, the two carrier tables 8a and 8b in their respective standby states are seen as deviated in position from one to the other in a rotary or turning direction of the ring bosses, this (shown in FIG. 14) being a standby state of the handling robot. Turning each ring boss from this state will cause each carrier table 8a, 8b to be moved back and forth, or the handling robot will be permitted to be turned or swung in this standby state. Then, the two carrier tables 8a and 8b, not overlaping each other in the rotary direction, are positioned vertically identically to each other as shown in FIG. 13. It should also be noted that the end of the first arm 27a is curved outwards so that it may not be interfered by the end of the third arm 27c.

The handling robot A' constructed as so far described can perform an operation that is to be described in FIGS. 15 through 18. Thus, in the state in which one of carrier tables 8a has an unprocessed wafer W1 carried thereon, the handling robot in its standby state will be turned as a whole (FIG. 15) to position a vacant carrier table 8a, the carrier table not having any wafer at all carried thereon in front of a process chamber station 2e having a processed wafer W2 (FIG. 15).

Then, the vacant carrier table 8b will be moved into the process chamber station 2e to accept the processed wafer W2 thereon and to convey it out (FIG. 16). Thereafter, the handling robot will be turned as a whole in its standby state and continue to be turned until the carrier table 8a having the unprocessed wafer W1 carried thereon reaches in front of the process chamber station (FIG. 17). The angle of turning that the handling robot must then make as a whole needs only to correspond to a difference in angular position between the carrier tables 8a and 8b and is, for example, about 45 degrees.

The carrier table 8a having the unprocessed wafer W1 carried thereon will be moved to project into the process chamber station 2e and to set it in position within the process chamber station 2e (FIG. 18). Subsequently, the handling robot will retract the carrier table 8a now vacant into a transfer chamber 1 side and will then be turned as a whole to move the carrier table 8b until the processed wafer W2 reaches in front of the process chamber station 2a for a next processing. The operation described will be repeated.

On the other hand, the handling robot A" referred to above is depicted in FIGS. 20 through 22. In these Figures, reference numeral 30 denotes a turn table turnably supported on the frame of the transfer chamber 1. At the turning center of the turn table 30, a drive shaft 31 is supported rotatably with respect to the turn table 30. And, the turn table 30 is adapted to be driven to turn normally and reversely by a first motor unit 32a fastened to a frame of the transfer chamber 1 while the drive shaft 31 is adapted to be driven to rotate normally and reversely by a second motor unit 32b fastened to a turn table 30.

A first and a second robot link mechanism B1 and B2 are provided at the opposite sides of the axial center of the drive shaft 31, and each of which comprises a drive link mechanism 33, 34 that is here constituted by a parallel linkage. The first drive link mechanism 33 comprises a driving and a driven link 33a and 33b extending in parallel to each other and a coupling link 33c that connects the ends of these two links 33a and 33b together. Also, the second drive link mechanism 34 comprises a driving and a driven link 34a and 34b extending in parallel to each other and a coupling link 34c that connects the ends of these two links 34a and 34b together.

And, the respective driving links 33a and 34b of the two drive link mechanisms 33 and 34 have their respective bases fastened and thereby connected to the drive shaft 31. Also, the driven links 33b and 34b through their respective bases are pivotally supported on the turn table 30 so that lines passing through their respective bases and the drive shaft 31 may orient relative to each other with an angle α (60 degrees) about the center of rotation (turning) of the turn table 30. The respective coupling links 33c and 34c of the two drive link mechanisms 33 and 34 have at their respective two opposite ends, support shafts 35a and 35b; and 36a and 36b with gears 37a and 37b in mesh with each other; and gears 37c and 37d in mesh with each other, the gears having an identical number of teeth. Of those support shafts, the support shafts 35a and 36a lying at the respective ends of the driving links 33a and 34a are integrally connected thereto, respectively while the support shafts 35b and 36b are freely rotatable relative to the driven links 33b and 34b, respectively.

Connected respectively to the end sides of the drive link mechanisms 33 and 34 for the first and second robot link mechanisms B1 and B2 are a first and a second driven link mechanism 38 and 39 each of which is again constituted by a parallel linkage that is identical in size to the parallel linkage constituting each drive link mechanism 33, 34. The first driven link mechanism 38 comprises a driving and a driven link 38a and 38b extending in parallel to each other and a coupling link 40a that connects the these two links 38a and 38b together. Also, the second driven link mechanism 39 comprises a driving and a driven link 39a and 39b and a coupling link 40b that connects these two links 39a and 39b together.

Of base ends of these links, the base ends of the driving links 38a and 39a are integrally joined with the support shafts 35b and 36b at the driven link 33b and 34b sides of the first and second drive link mechanisms 33 and 34, respectively while the base ends of the driven links 38b and 39b are rotatably connected to the support shafts 35a and 36a, respectively.

And, the carrier tables 8a and 8b are integrally connected to the links 40a and 40b at the end sides of the driven link mechanisms 38 and 39, respectively. Because of each linkage configuration of the two driven link mechanisms 38 and 39 and the configuration of the two carrier tables 8a and 8b, the two carrier tables 8a and 8b are allowed to take a vertically identical position as shown in FIG. 22. Also, the two carrier tables 8a and 8b have their respective base ends ensured not for them to interfere with each other.

Also, the two carrier tables 8a and 8b are here arranged to lie on and be in alignment with the extensions of the links 40a and 40b at the end sides of the two driven link mechanisms, respectively. Consequently, the two carrier tables 8a and 8b stand angularly deviated in position from each other about the center of turning of the turn table 30 by the angle α mentioned previously. In FIG. 22 there is also shown a magnetic fluid seal 41.

An explanation will now be given of an operation of the third type of handling robot A" constructed as so far described.

In the standby state shown in FIG. 21, driving the second motor unit 32b to rotate normally or reversely to rotate the drive shaft 31, e. g., clockwise will cause the respective driving links 33a and 34a in the drive link mechanisms 33 and 34 for the first and second robot link mechanisms B1 and B2 mechanisms 33a and 34a to turn clockwise as a whole.

This will, as shown in FIG. 20 , cause the first and second driven link mechanisms 38 and 39 through the joint action of the gears 37a, 37b, 37c and 37d to turn counter-clockwise, permitting the carrier table 8a on the first robot link mechanism B1 to move forwards or advance and the second carrier table 8b on the second robot link mechanism B2 to be moved back or retracted. The carrier tables 8a and 8b will be moved forth and back in the directions defined by the angles α1 and α2 that represent the respective angles of the angular deviation of the respective bases of the driven links 33b and 34b of the first and second drive link mechanisms 33 and 34, respectively. The angles α1 and α2 make the angle α.

Conversely, driving the drive shaft 31 reversely or counter-clockwise will retract the carrier table 8a on the first robot link mechanism B1 in the angular direction defined by the angle α1 while the carrier table 8b on the second robot link mechanism B2 will advance the carrier table 8b on the second robot link mechanism B2 in the angular direction defined by the angle α2.

In the standby state shown in FIG. 21, driving the first motor unit 32a will turn the turn table 30 to cause the first and second robot link mechanisms B1 and B2 to turn jointly.

Being arranged to permit a pair of carrier tables to be advanced or moved to project and retracted in the angular directions of 45 degrees or 60 degrees, it is seen that the second and third types of handling robot A' and A" so far described reduce the turning angle for the robot system to turn as a whole where wafers are to be exchanged, compared with the first handling robot A described earlier that entails a phase deviation of 180 degrees. However, the reduction still require the entire robot to be turned by as much as 45 degrees or 60 degrees where wafers are to be exchanged if such angles are considered small. And, with the second and third handling robots A' and A" as with the first type of handling robot A, the entire robot system must still be turned only after a carrier table advanced into a process chamber station 2e is retracted into the transfer chamber 1 and then brought into its standby state. Thus, a loss of time remains to be involved in the operation in which the carrier table are being advanced or moved to project and retracted. As a consequence, the reduction of the cycle time still remains at most as much as the angle by which the handling robot needs to be turned is simply reduced to 45 degrees or 60 degrees from 180 degrees.

Created in the foregoing taken into account, the present invention has for an object thereof to provide a handling robot control method that permits the cycle time of an entire robot handling operation for a handling robot both to be turned and to be advanced or moved to project and retract or to move forth and back the carrier tables to be shortened.

DISCLOSURE OF THE INVENTION

Created with the foregoing taken into account, a handling robot control method is provided in accordance with the present invention in a certain aspect thereof for a handling robot disposed in a transfer chamber having a plurality of process chamber stations arranged around it in communication therewith via respective gates, the robot having a first and a second carrier table that are deviated in turning angular position from one to the other about a center of turning, the robot performing an operation to move the said first and second carrier tables to turn jointly in the said transfer chamber and also an operation to move the said first and second carrier tables individually either to project through said gate into said process chamber station or to retract into the said transfer chamber, which method comprises: overlapping said operation to move the said first and second carrier tables individually either to project or to retract with said operation to move the said first and second carrier tables to turn jointly.

According to the handling robot control method described above, it can be seen and should be appreciated that as a result of overlapping an operation of moving the carrier tables individually to project or to retract with an operation of moving the two carrier tables to turn jointly, the cycle time of an entire robot handling operation for a handling robot both to be turned and to be moved so as to move the two carrier tables individually either to project or to retract may be shortened.

It is preferred that the said carrier tables in the said overlapped operations follow a path of movement that does not pass a point of intersection of a path of movement along which to move the said first and second carrier tables individually either to project or to retract and a path of movement along which to move the said first and second carrier tables to turn jointly, but that follows a short-cut curve.

Also, the said operation to move the said first and second carrier tables individually either to project or to retract that is performed while overlapping with the said operation to move the said first and second carrier tables to turn jointly is performed so as not to interfere with the said gate.

BRIEF DESCRIPTION OF THE DRAWINGS

The present invention will better be understood from the following detailed description and the drawings attached hereto showing certain illustrative embodiments of the present invention. In this connection, it should be noted that such embodiments as illustrated in the accompanying drawings hereof are intended in no way to limit the present invention but to facilitate an explanation and understanding thereof.

BEST MODES FOR CARRYING OUT THE INVENTION

Hereinafter, suitable embodiments of the present invention implemented with respect to a handling robot control method are set out with reference to the accompanying drawings hereof.

An explanation will now be given of a certain form of embodiment of the present invention based on the second handling robot A' described hereinbefore.

Figure 23A:
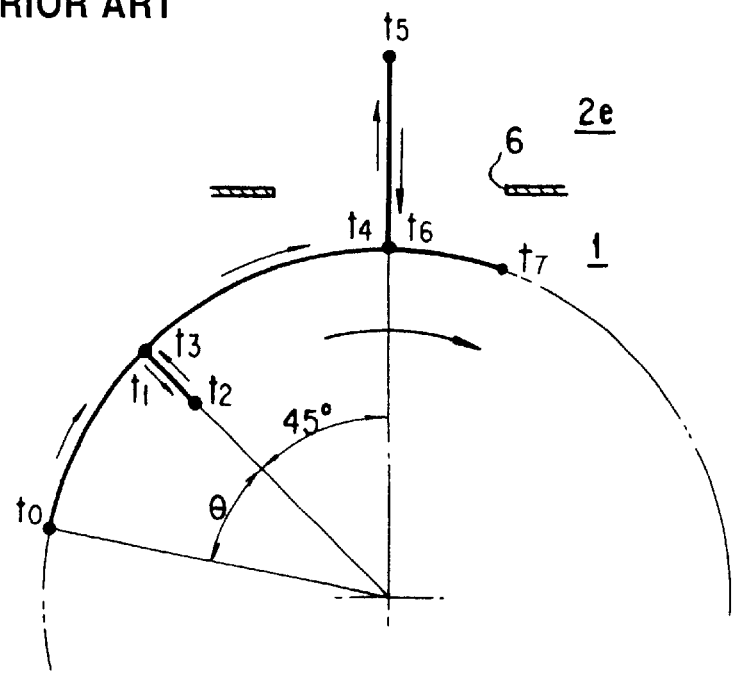
FIGS. 23A and 23B are graphs that shows a path of movement of a carrier table in the second type of handling robot.
Figure 23B:
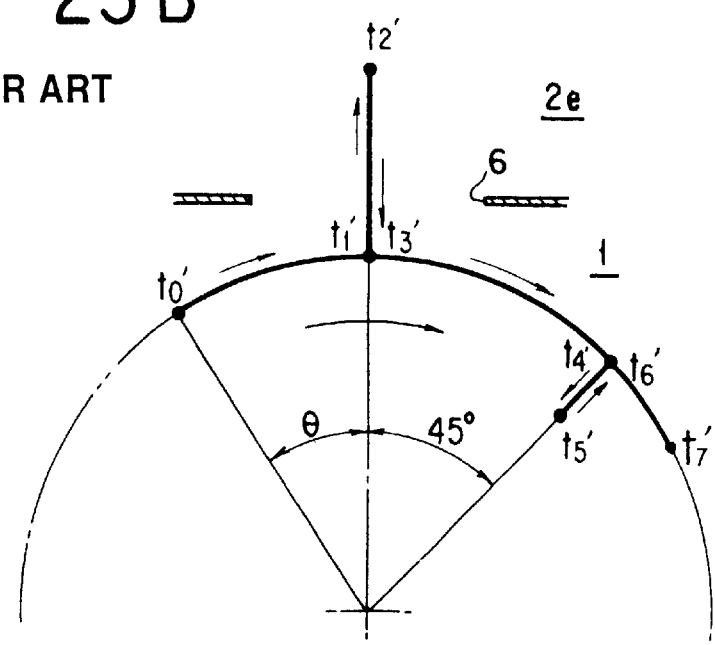

First, while the conventional operation of the pair of carrier tables 8a and 8b in the second type of handling robot A' was described hereinbefore in connection with FIGS. 15 through 19, the movements then taken by the end portions of the two carrier tables 8a and 8b need to be analyzed in detail with reference also to FIGS. 23A and 23B. FIG. 23A shows the movement of the first carrier table 8a and FIG. 23B shows the movement of the second carrier table 23B. The points t0 to t7 and t0' to t7', and the lines connecting these points shown represent the positions of the centers of the ends of the carrier tables 8a and 8b, and the paths that they follow, respectively.

Figure 1:
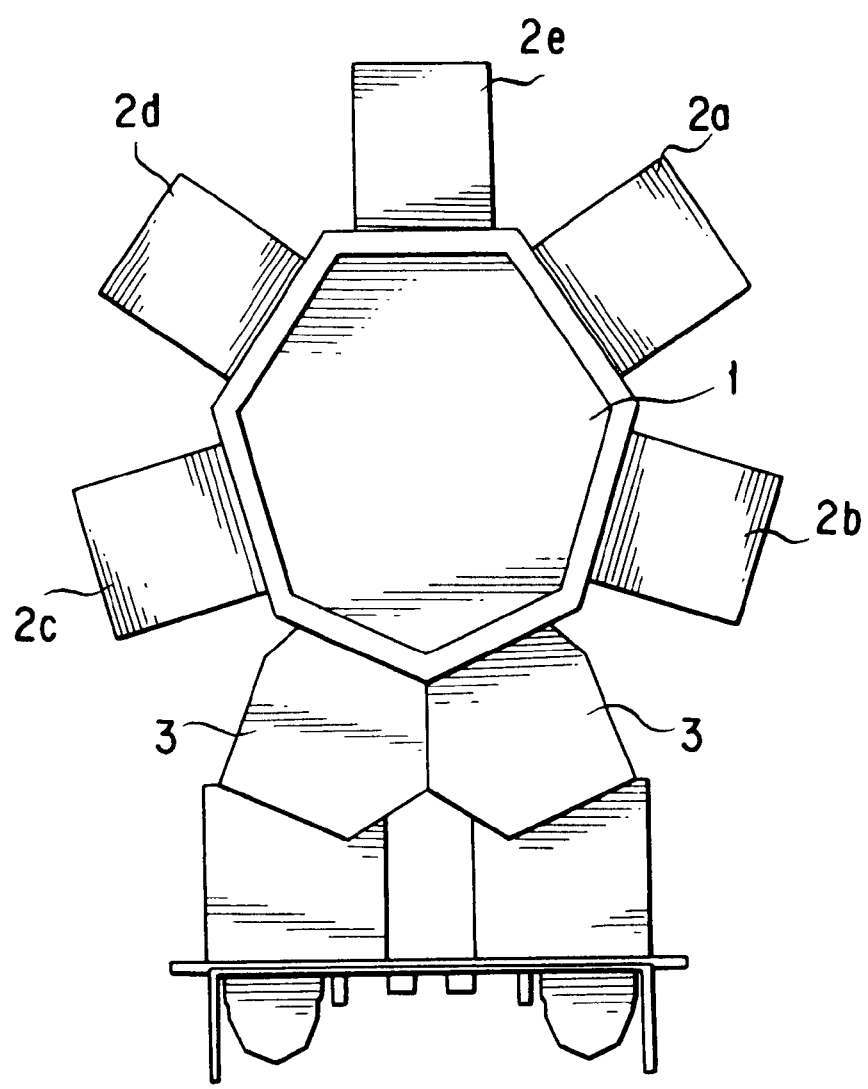
FIG. 1 is a diagrammatic plan view of a semiconductor manufacturing system that represents an example of a multiple chamber type manufacturing system.
Figure 2:
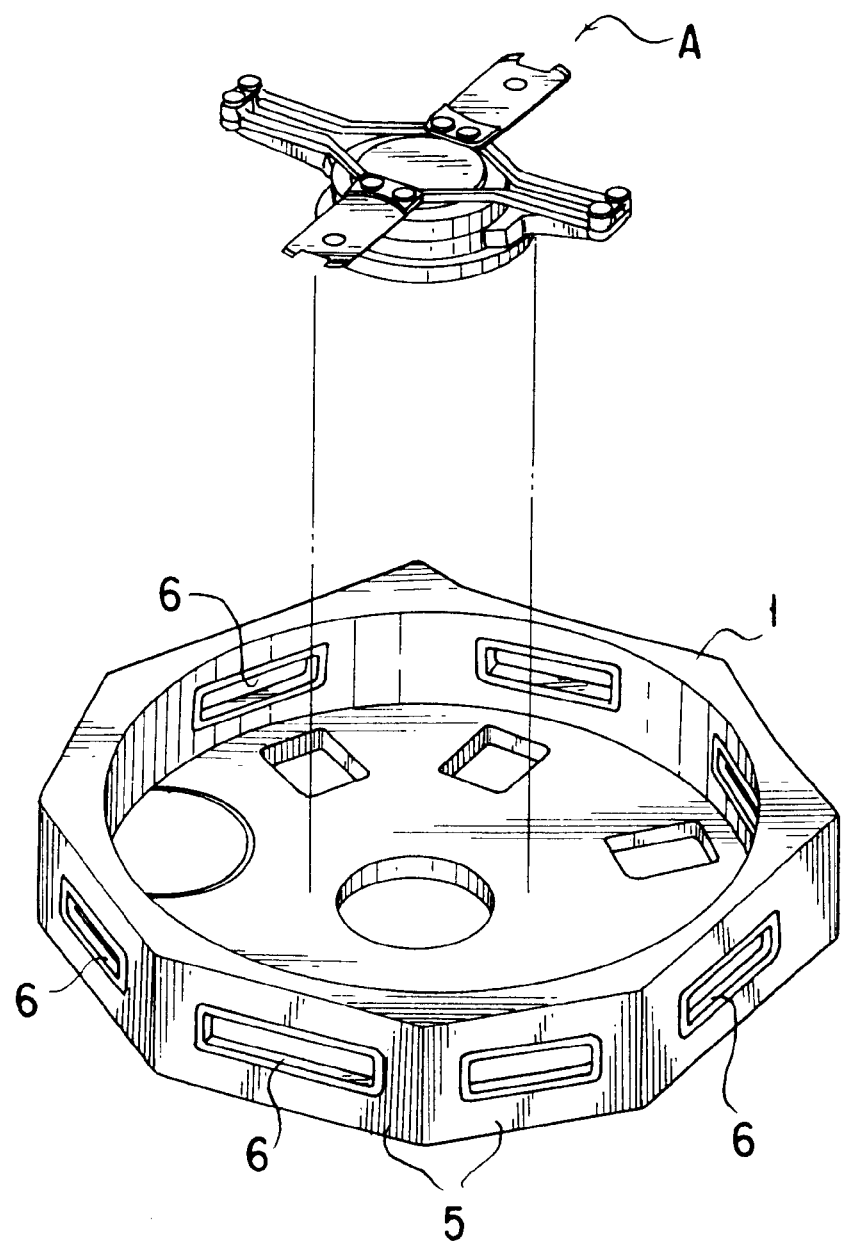
FIG. 2 is a broken perspective view that shows a relationship between a transfer chamber and a handling robot.
Figure 3:
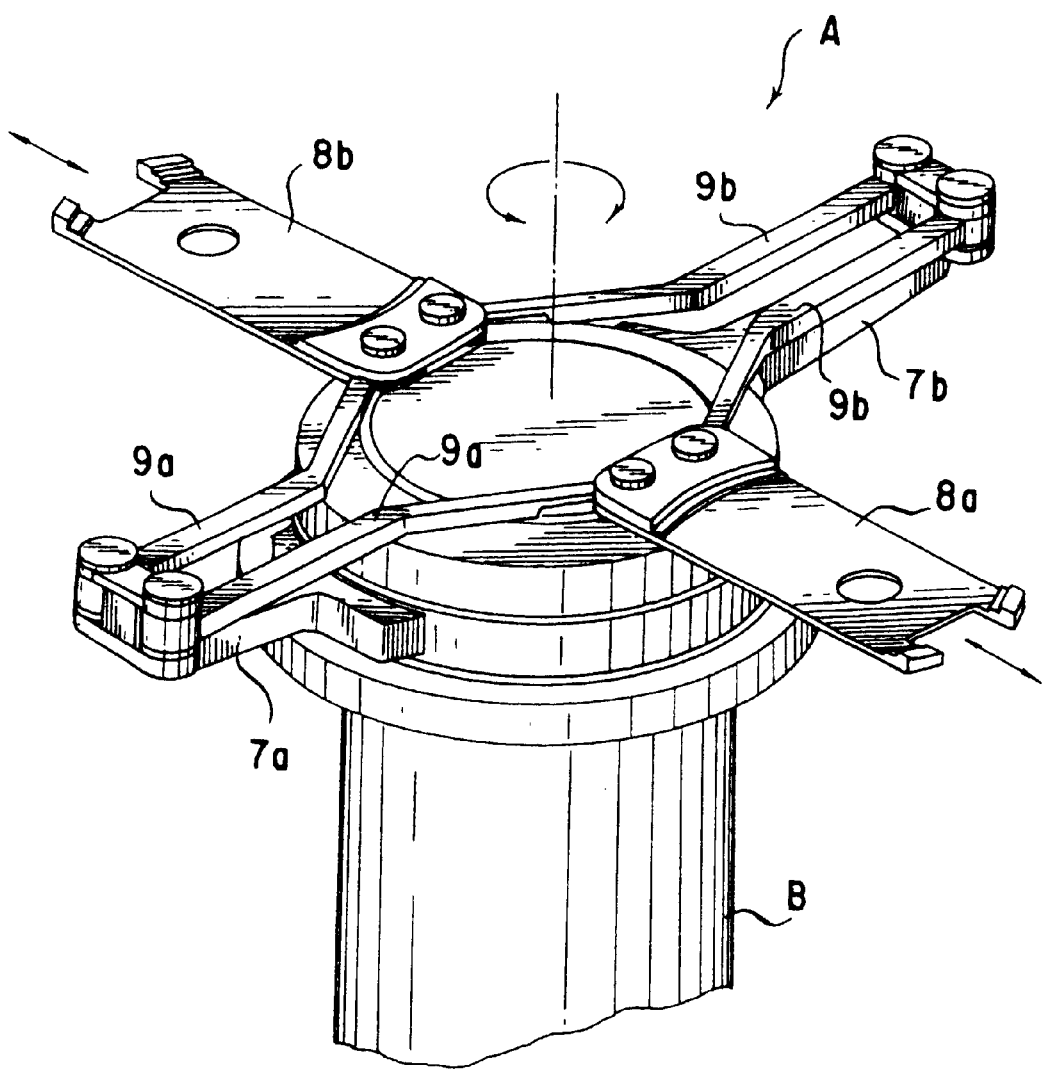
FIG. 3 is a perspective view that shows a first handling robot.
Figure 4A:
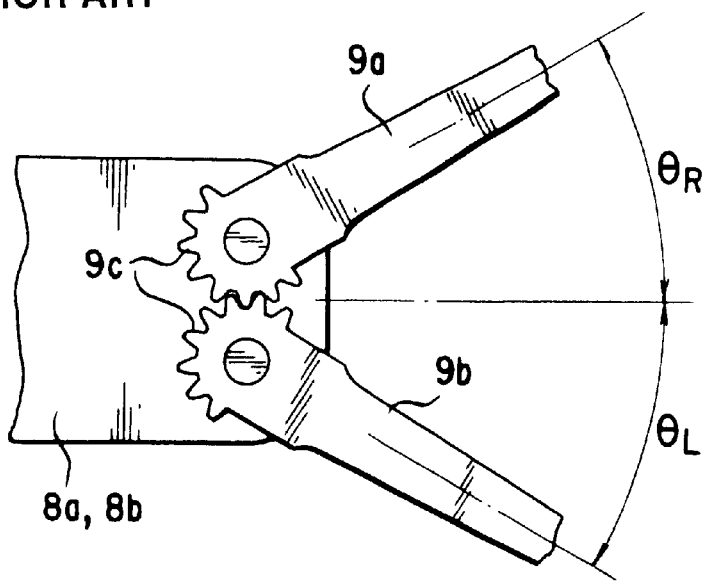
FIGS. 4A and 4B are diagrammatic explanatory views that shows a carrier table posture control mechanism
Figure 4B:
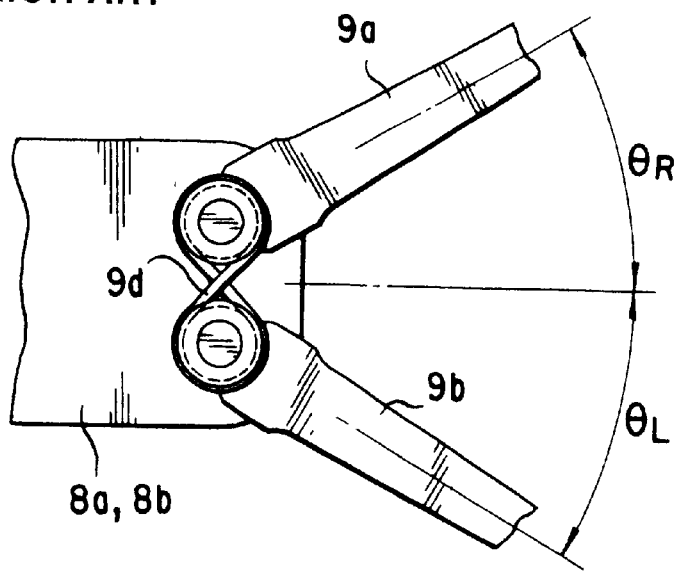
Figure 5:
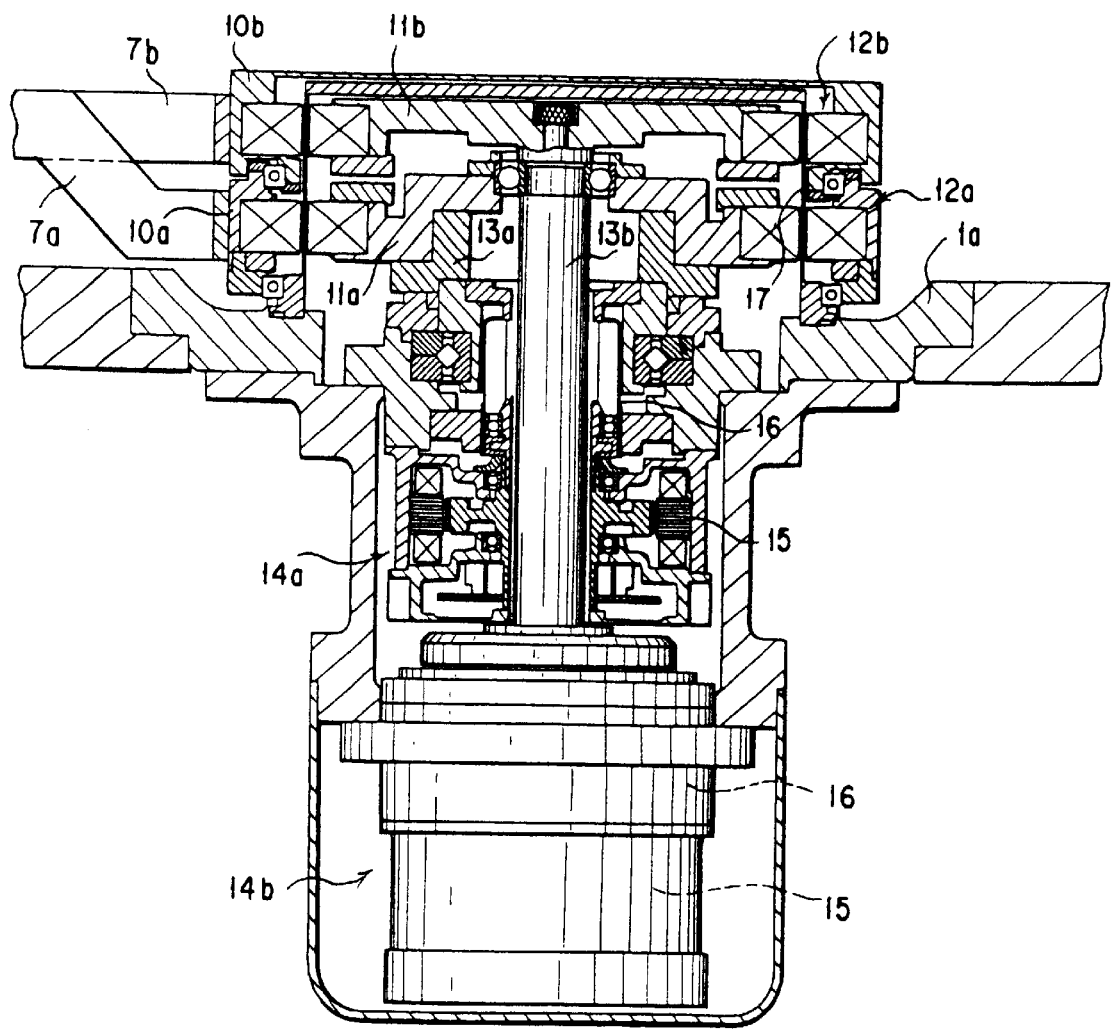
FIG. 5 is a cross sectional view that shows a turning mechanism for a first arm.
Figure 6A:
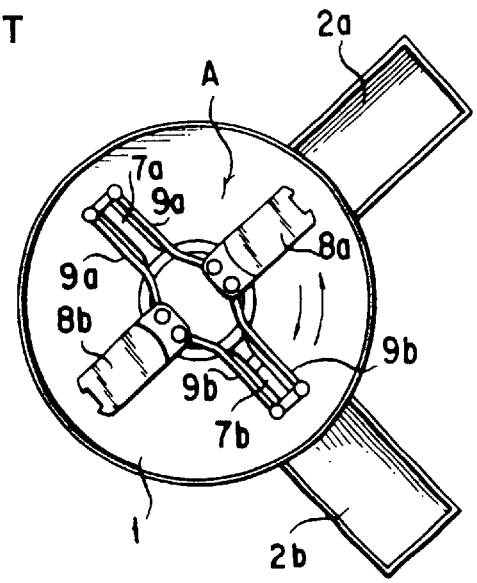
FIGS. 6A and 6B are an operation explanatory views for the first handling robot.
Figure 6B:
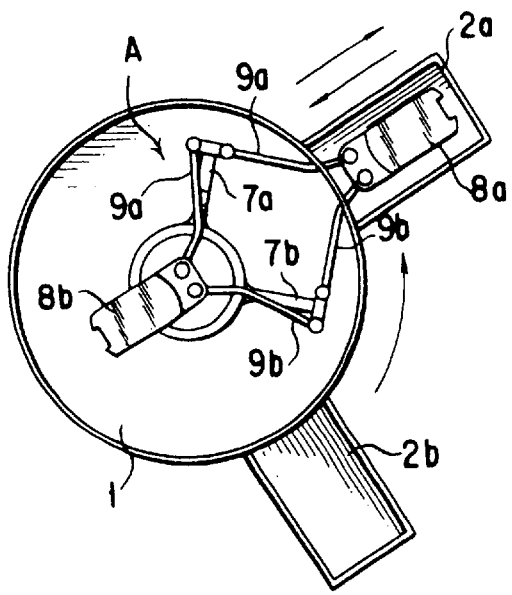
Figure 7:
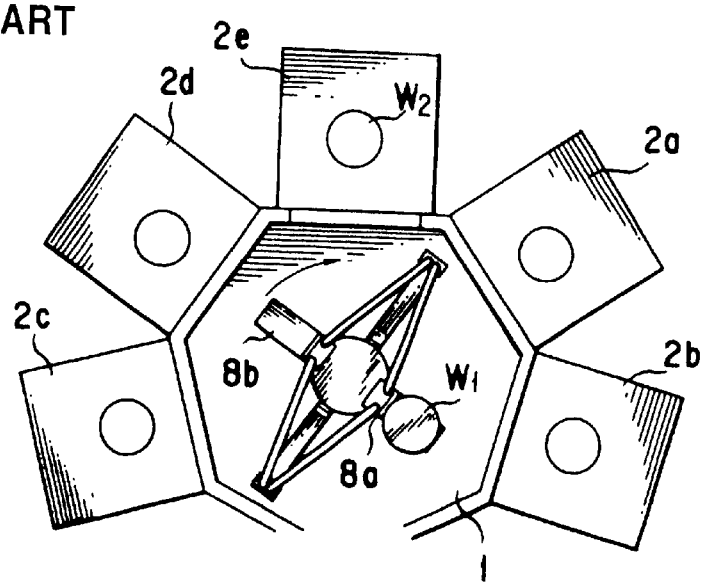
FIG. 7 is an explanatory view showing an operation of a station for the first handling robot.
Figure 8:
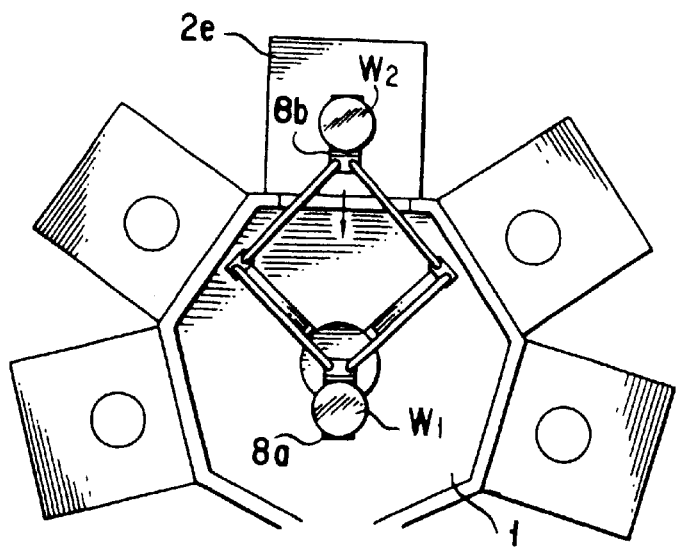
FIG. 8 is an explanatory view showing an operation of a station for the first handling robot.
Figure 9:
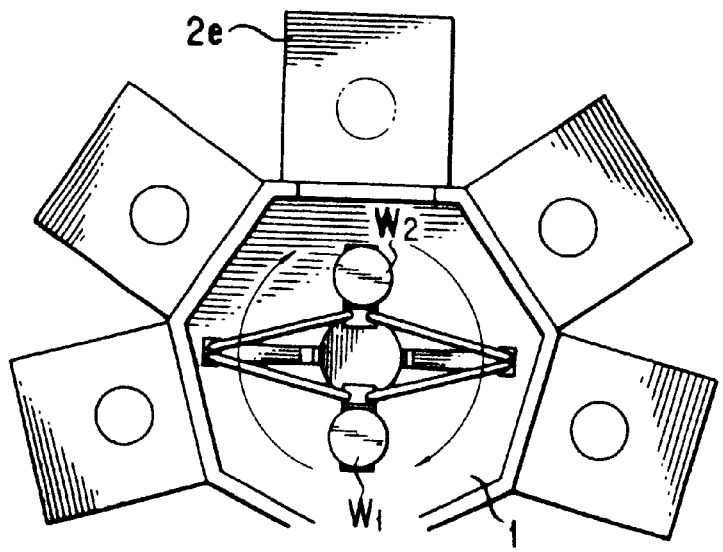
FIG. 9 is an explanatory view showing an operation of a station for the first handling robot.
Figure 10:
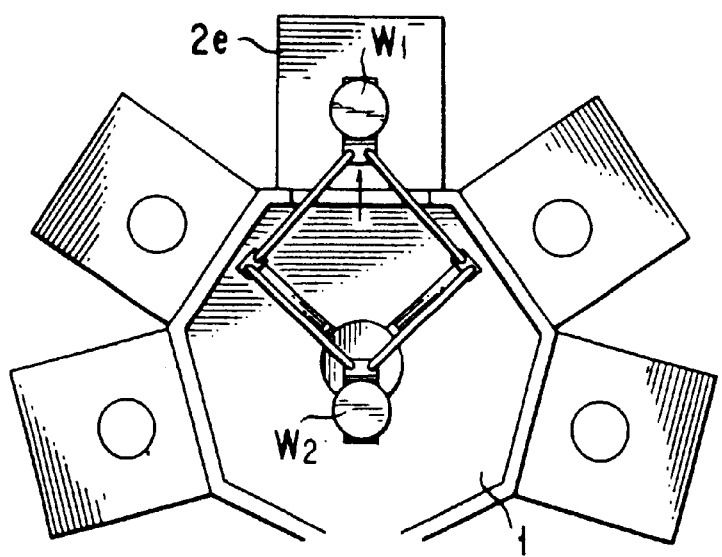
FIG. 10 is an explanatory view showing an operation of a station for the first handling robot.
Figure 11:
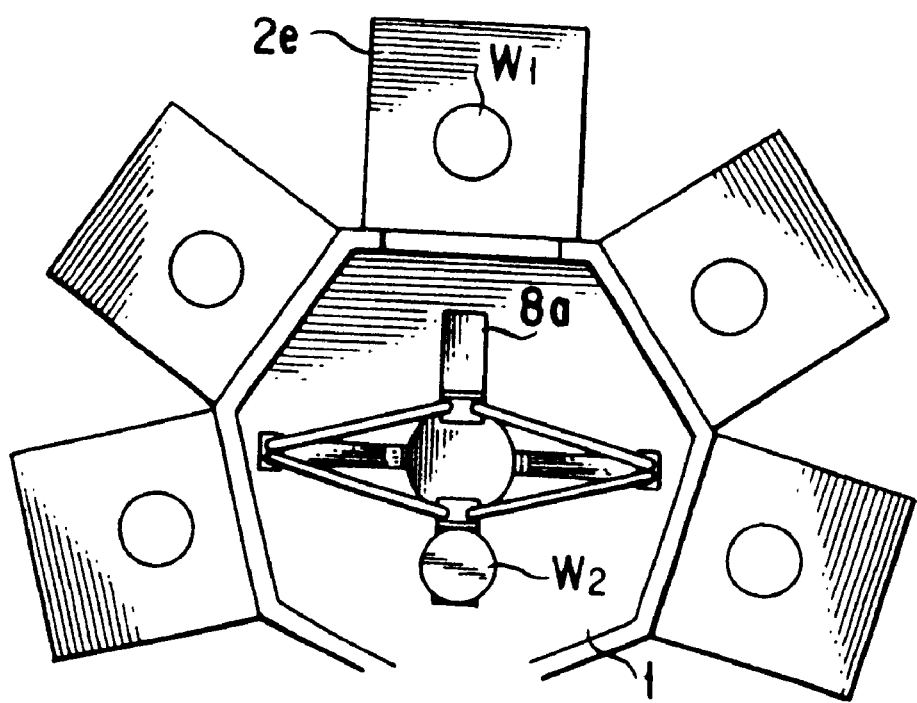
FIG. 11 is an explanatory view showing an operation of a station for the first handling robot.
Figure 12:
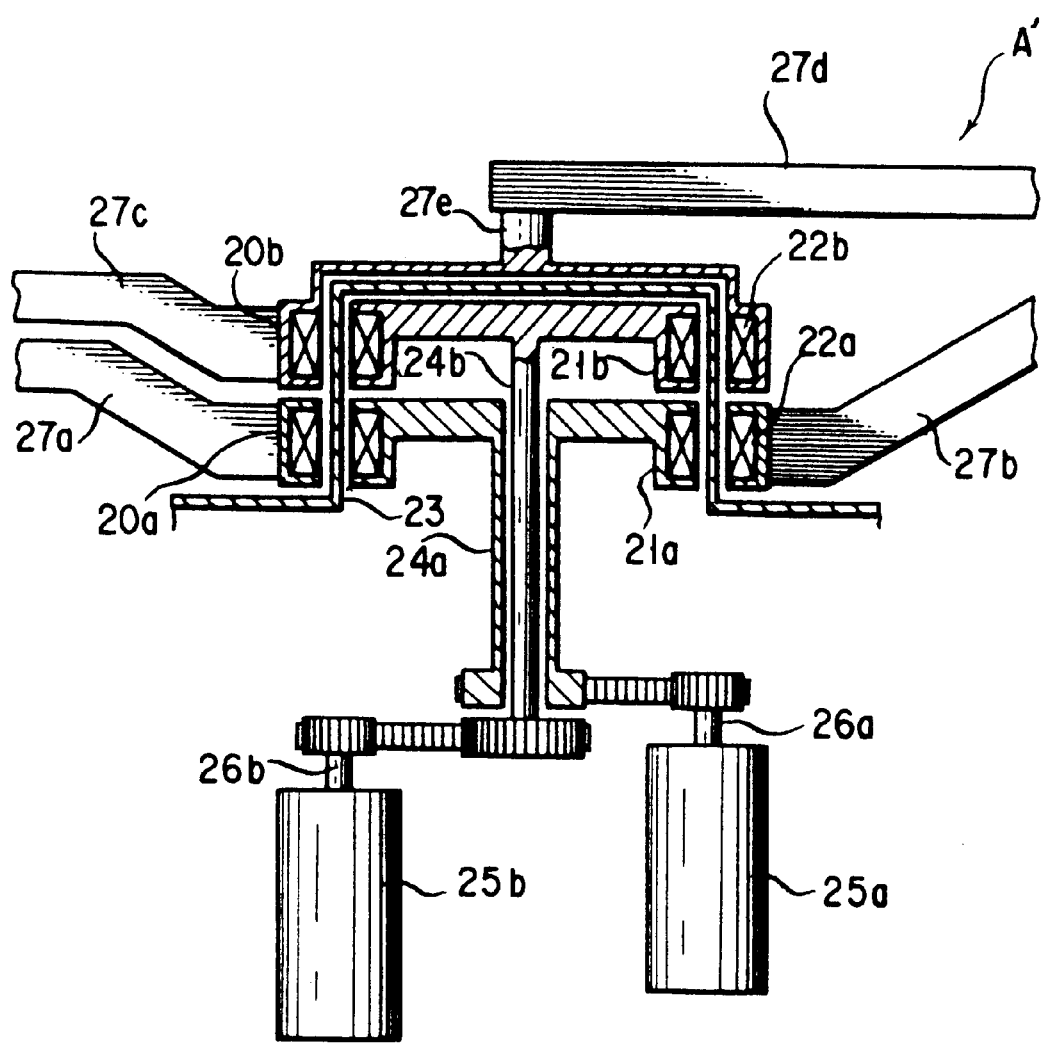
FIG. 12 is a cross sectional view that shows a boss portion of a second type of handling robot.
Figure 13:
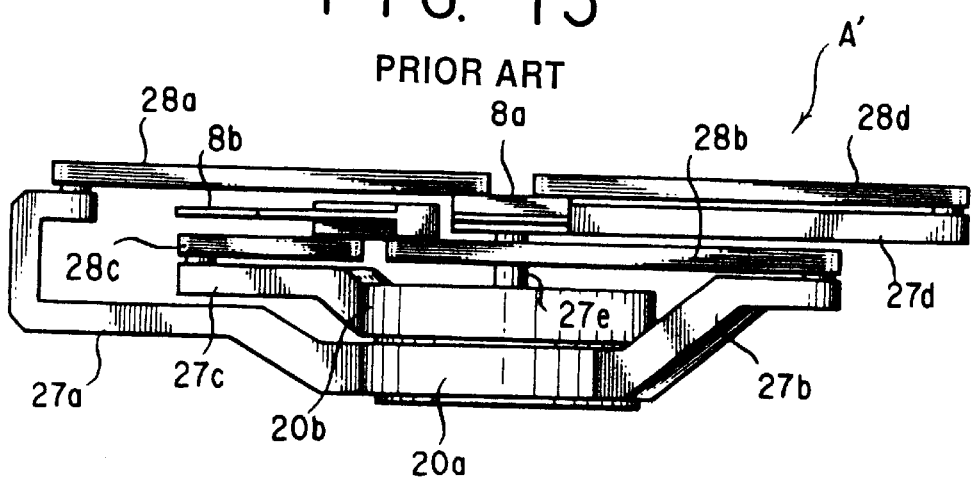
FIG. 13 is front view that shows the second type of handling robot.
Figure 14:
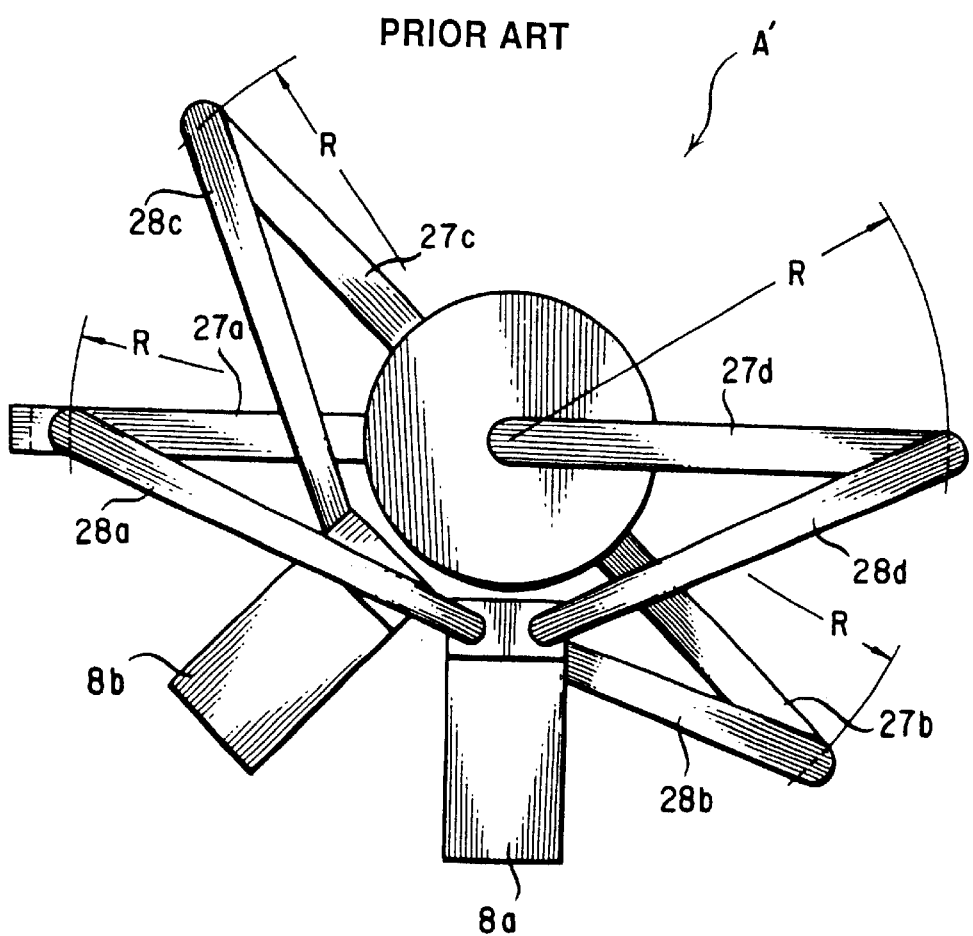
FIG. 14 is a plan view that shows the second type of handling robot.
Figure 15:
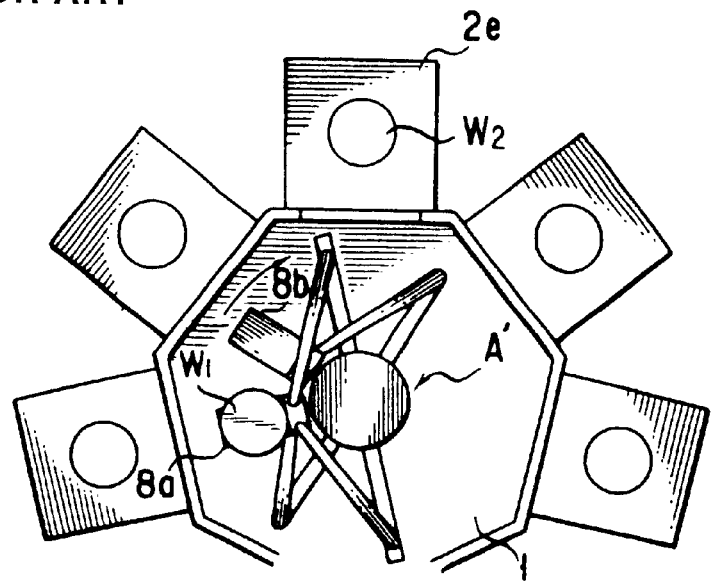
FIG. 15 is an operation explanatory view for a process chamber station in connection with the second type of handling robot.
Figure 16:
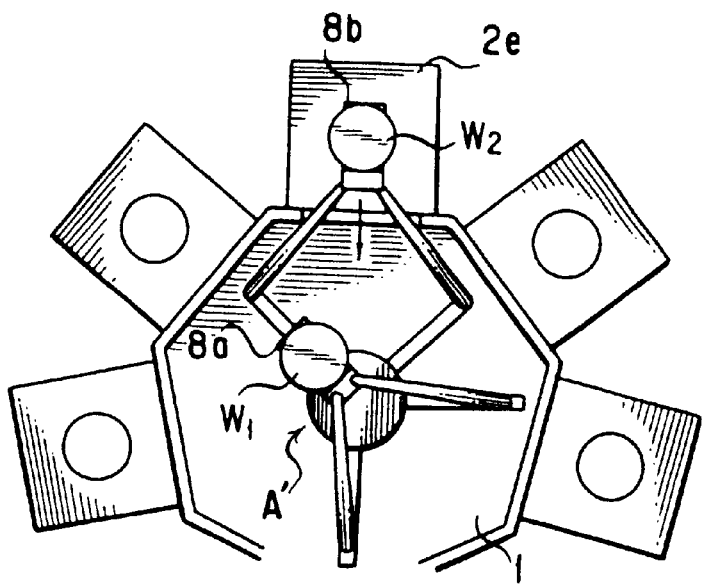
FIG. 16 is an operation explanatory view for a process chamber station in connection with the second type of handling robot.
Figure 17:
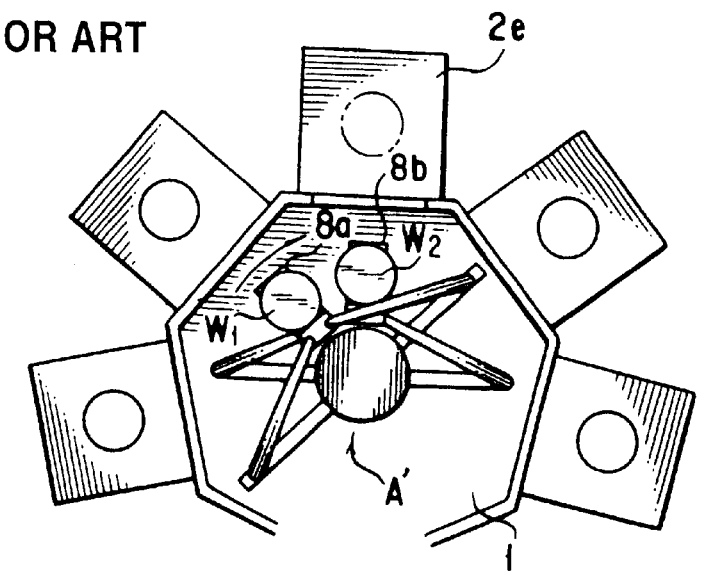
FIG. 17 is an operation explanatory view for a process chamber station in connection with the second type of handling robot.
Figure 18:
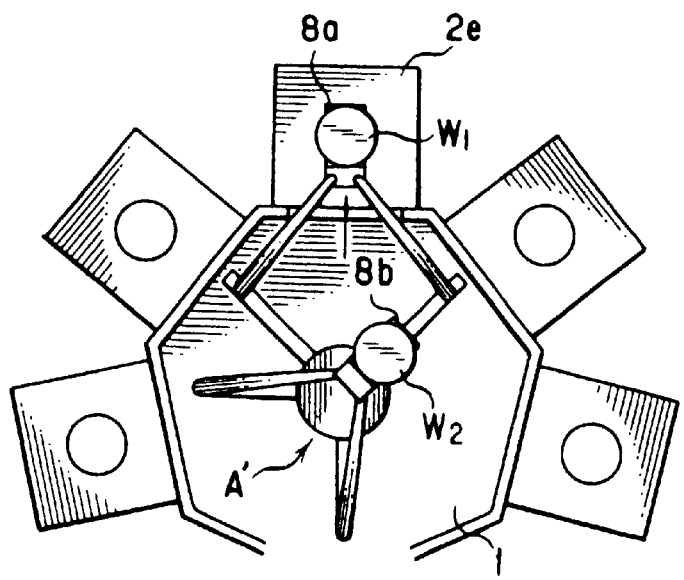
FIG. 18 is an operation explanatory view for a process chamber station in connection with the second type of handling robot.
Figure 19:
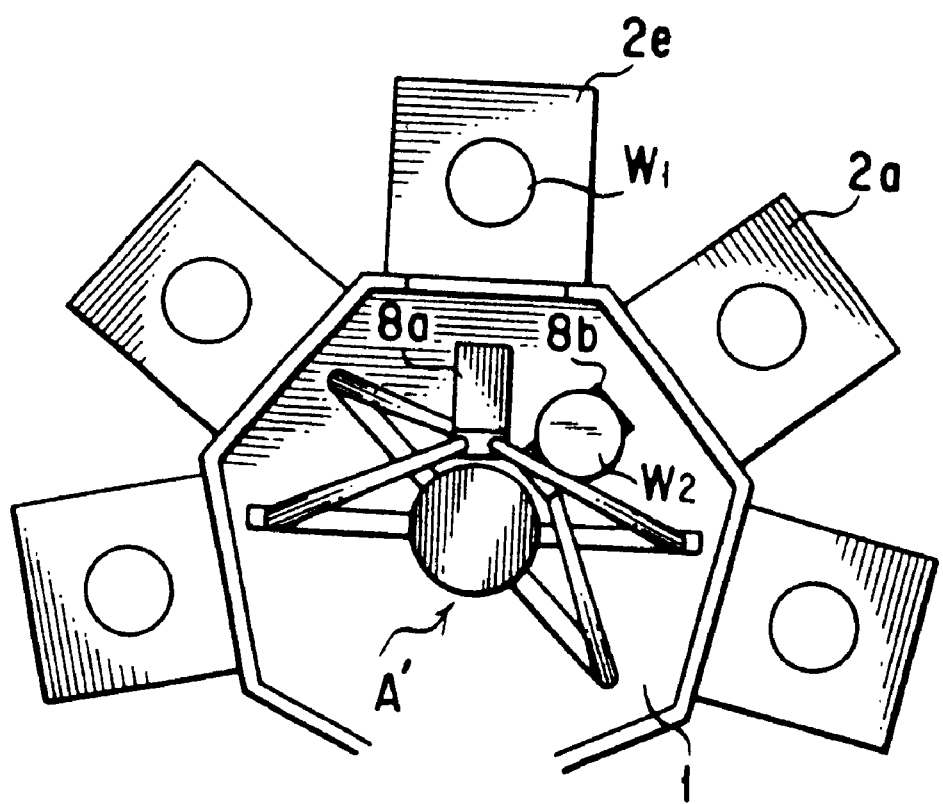
FIG. 19 is an operation explanatory view for a process chamber station in connection with a second type of handling robot.

In their standby state shown in FIG. 15, the first and second carrier tables 8a and 8b are positioned at t0 as shown in FIG. 23A and at t0' as shown in FIG. 23B, respectively. And, if the carrier tables 8a and 8b are moved to turn jointly by an angle θ from the standby state shown in FIG. 15 to arrive in a state immediately before the state shown in FIG. 16, the second carrier table 8b is shown in FIG. 23B to reach the position t1' where the second carrier table 8b lies in front of the process chamber station 2e and stands by. At this time, the first carrier table 8a is shown in FIG. 23A to have reached the position t1. The second carrier table 8b will then be moved by a predetermined stroke distance to project through the gate 6 into the intended process chamber station 2e, thus reaching the position t2". At this time, the first carrier table 8a in the standby side will be being retracted and have moved somewhat, ganged in motion with the second carrier table 8b, into the transfer chamber, thus arriving at the position t2.

The position t3' is the position taken by the second carrier table 8b when the carrier table 8b having passed through the gate 6 is retracted into the transfer chamber 1 side to stand by there. Then, the first carrier table 8a will also have come into its standby state t3. The positions t4 and t4' are the positions taken by the first and second carrier tables 8a and 8b, respectively, when for the first carrier table 8a to be oriented towards the intended process chamber station 2e the two carrier tables 8a and 8b have jointly be turned by a required angle, say 45 degrees. The position t5 is the position taken by the first carrier chamber 8a that has been moved through the gate 6 into the process chamber station 2e, when the second carrier table 8b ganged in motion with the first carrier table 8a has been retracted, thus arriving at the position t5'. The positions t6 and t6' are the positions taken by the first and second carrier tables 8a and 8b, respectively, when the first carrier table 8a leaving the process chamber station 2e through the gate 6 is retracted into the transfer chamber 1 side to stand by there.

Subsequently, if to be combined with a next sequence of operation, that is, if the two carrier tables 8a and 8b are to be turned further to allow the second carrier table 8b to be moved to project into the next process chamber station 2a, the foregoing operation is followed by retracting the first carrier table 8a to the position t6, thus back to the position t4 where it was moved to project, after which such a turning action can be performed to move the carrier table 8a to the position t7 while permitting the second carrier table 8b to arrive at the position t7'.

In the operation described above, it is seen that the action to move each of the carrier tables 8a and 8b forth or to project and the action to move it back or retract it are carried out separately of the turning action for the entire robot. Thus, the cycle time T of the robot handling operation in which when the first carrier table 8a is turned by 45 degrees from its most retracted position t2 (as for the second carrier table 8b is turned from its most projecting position t2') and moved into the process chamber station 2e up to the position t5 is expressed as follows:

$$T = (t3 - t2) + (t4 - t3) + (t5 - t4)$$
$$= (t3' - t2') + (t4' - t3') - (t5' - t4')$$

where t2, t3, t4, t5, t2', t3', t4' and t5' represent here times when the positions shown as so indicated are taken. It is thus seen that the time period (t4–t3) or (t4'–t3') in which the turning action is performed, is directly added.

The method according to the present invention seeks to shorten such an entire cycle time of an entire robot handling operation involving moving each of the carrier tables 8a and 8b forth or to project and moving it back or retracting it, and turning them jointly, by performing these moving forth and back operations while the turning operation is being performed.

An explanation will now be given of this invented method on the second type of handling robot A' with reference to FIGS. 24A and 24B with continued reference to FIGS. 15 to 19.

Figure 24A:
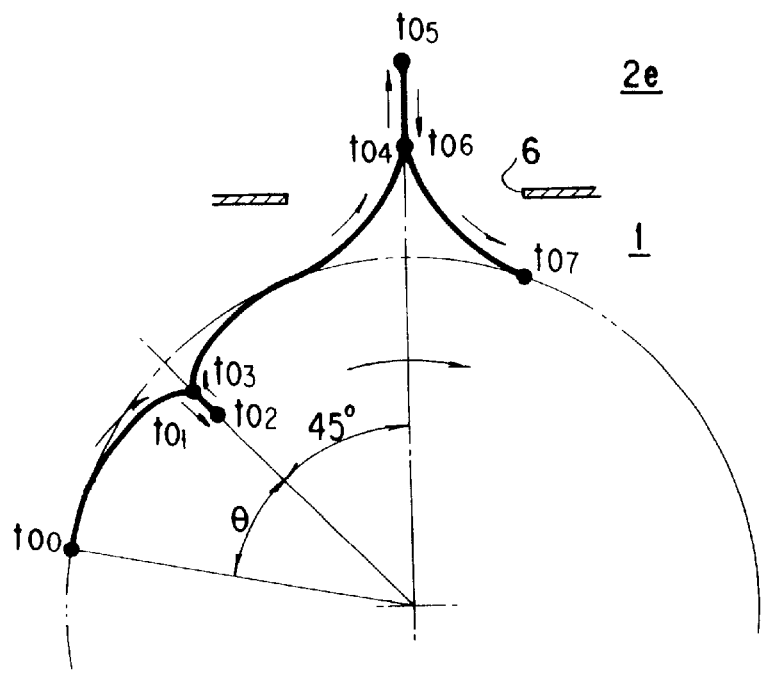
FIGS. 24A and 24B are graphs that show a path of movement of a carrier table in an operation of a handling robot according to the present invention.
Figure 24B:
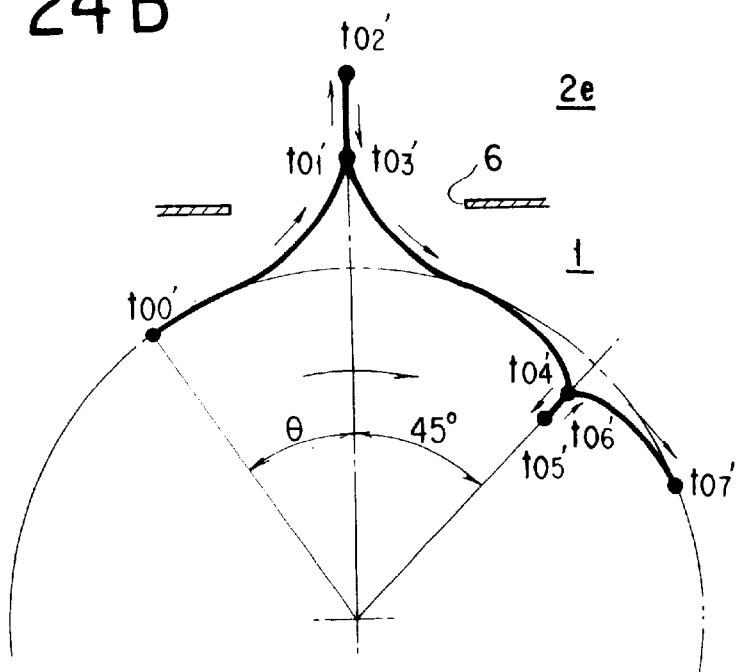

In their standby state shown in FIG. 15, the first and second carrier tables 8a and 8b are positioned at t00 as shown in FIG. 24A and at t00' as shown in FIG. 24B, respectively. The points t00 to t07 and t00' to t007', and the lines connecting these points shown represent here again the positions of the centers of the ends of the carrier tables 8a and 8b, and the paths that they trace, respectively.

A sequence of steps of operation in which the two carrier tables 8a and 8b are jointly turned from their standby state shown in FIG. 15 by an angle θ to bring the second carrier table 8b in front of a process chamber station 2e and to move the carrier table 8b through the gate 6 to project into this process chamber station 2e, thereafter the two carrier tables 8a and 8b are turned jointly by 45 degrees to retract the second transfer chamber 8b into the transfer chamber 1 side while the first carrier table 8a is moved to project into the same process chamber station 2e, and thereafter it is retracted into the transfer chamber 1 side will now be explained.

In the standby state shown in FIG. 15, the first and second carrier tables 8a and 8b lie at the position t00 of FIG. 24A and at the position t00' of FIG. 24B, respectively. While from this state the two carrier tables 8a and 8b are being jointly turned by an angle θ, the second carrier table 8b is gradually moved to project. In this step of operation, the second carrier table 8b is allowed to trace a path that is represented by, for instance, an arc or a clothoid curve and then to reach a position in front of the process chamber station 2e. And, the speed at which and the distance by which the second table 8b then moves to project while on its way of turning is relatively determined in relation to its turning speed and the size of the gate 6.

More specifically, the second carrier table 8b should be moved to project slowly compared with its turning speed until it reaches a position where it may interfere with the gate 6 and should be turned by a certain angle or until it reaches a position t01' where it may not interfere with the gate, from which it is moved to project at a speed of projection high compared with its turning speed to reach a position t02'. If the size of the gate 6 in the turning direction is large enough compared with the size of the carrier table 8b (or the wafer), the carrier table 8b may be moved to project while it is being turned until the end position of projection t02' is reached. Alternatively, the speed of motion to project may be constant.

Then, the first carrier table 8a ganged in motion with the second carrier table 8b will be moved to retract somewhat into the transfer chamber 1 and, passing through the position t01, to arrive at the position t02.

Subsequently, the second carrier table 8b is moved to retract from the process chamber station 2e through the gate 6 into the transfer chamber 1. The first carrier table 8a that has been turned by 45 degrees is then moved to project into the process chamber station 2e. Then, the second carrier table 8b while it is held against turning or while it is being turned very slowly will be moved to retract from the position t02' to a position immediately ahead of the position t03' and thus until it reaches the position where it may interfere with the gate 6. When a position t03' is reached where the second carrier table 8b may no longer interfere with the gate 6, it is moved to retract while the entire robot is turned from the position of the process chamber station 2e by 45 degrees.

The first carrier table 8a to be turned from the standby state by 45 degrees and then to project into the process chamber station 2e will, as the second carrier table 8b was moved to project, be slowly moved to project while it is being turned up to a position where it may interfere with the gate. When the first carrier table 8a reaches a position t04 where it may no longer interfere with the gate 6, it will be moved to project rapidly until it reaches a position t05. In the mean time, the second carrier table 8b ganged in motion with the first carrier table 8a will be retracted to reach a position t05'.

In this movement of the first carrier table 8a to retract, if combined with a subsequent operation, namely in which the two carrier tables 8a and 8b are jointly turned to move the second carrier table 8b to project into a next process chamber station 2a, the first carrier table 8a as in the above described movement to project will be moved to retract to a position t06 where it may not interfere with the gate 6 in its turning direction, after which the first carrier table 8a will be moved to a position to 7 to retract while the first and second carrier tables 8a and 8b are being turned jointly. Then, the second carrier table 8b will arrive at a position t07'.

If the above described movements of the carrier tables 8a and 8b to project and to retract are adopted, the cycle time T0 of a robot handling operation in which the first carrier table 8a lies at its most retracted position t02 (or the second carrier table 8b lies at its most projecting position t02') to be then turned by an angle of 45 degrees and moved into the process chamber station 2e to reach its most projecting position t05 is expressed as follows:

$$T0 = (t03 - t02) + (t04 - t03) + (t05 - t04)$$
$$= (t03' - t02') + (t04' - t03') - (t05' - t04')$$

where t02, t03, t04, t05, t02', t03', t04' and t05' represent here times taken by the positions so indicated as shown, respectively.

For this cycle time T0, it is seen that the time period (t04−t03) is yielded from a path of curve traced by the first carrier table 8a not to pass the points of intersection of its turning path with its paths of motions to project and retract traced conventionally to yield the cycle time T previously described, but to take a short-cut, hence shortening the distance from the position t02 to the position t05. Likewise, the time period (t04'−t03') corresponds to a path of curve traced by the second carrier table 8b not to pass the points of intersection of its turning path with its paths of motions to project and retract traced conventionally to yield that cycle time T, but to take a short-cut, hence reducing the distance from the position t02' to the position t05'. As a comparison will make clear, therefore, the cycle time T0 is seen to be shorter than the cycle time T, demonstrating that the described form of embodiment of the present invention can accomplish an operation of interest that involves turning actions together with actions to project and retract more quickly than the prior art practice.

In this form of embodiment described, it can also be seen and should be appreciated that the positions t06 (t04) and t03' (t01') taken by the first and second carrier tables 8a and 8b for them not to interfere with the gate while they are each moved to project while turning are determined by the size of the gate 6 formed towards a turning path, the sizes of each carrier table and a wafer to be carried thereon, the speeds and degrees of acceleration of movements and so forth.

Paths to be traced by the carrier tables 8a and 8b to yield the cycle time T0 can be drawn depending on particular combinations of motions of the handling robot A' to turn and motion of the carrier tables 8a and 8b to project and retract, which motions are performed by operating the motor units 25a and 25b to drive them in a controlled manner. To this end, a conventional control unit is provided though not shown for controlling speeds and directions of rotation of the these two motor units 25a and 25b accurately and as desired.

Figure 20:
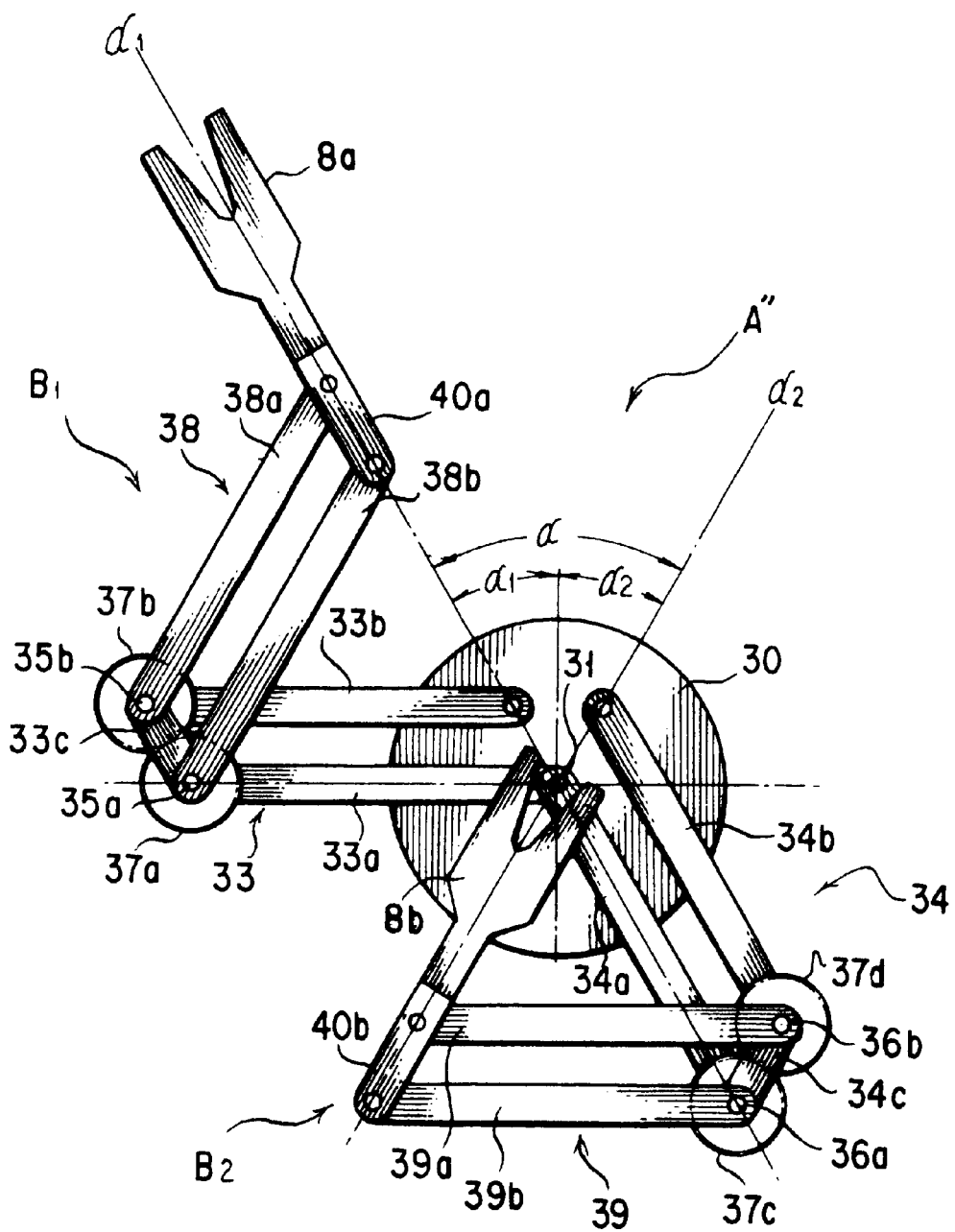
FIG. 20 is a plan view that shows the state in which the third type of handling robot is operating.
Figure 21:
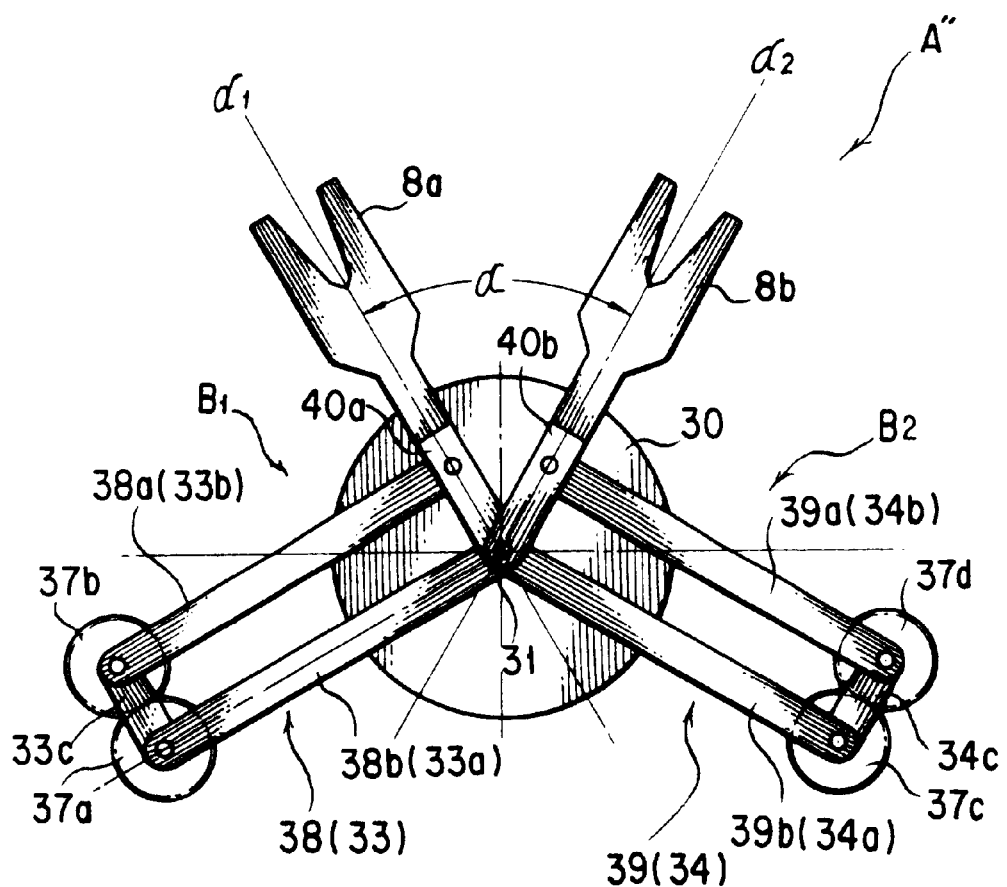
FIG. 21 is a plan view that shows the state in which the third type of handling robot is at its standby state.
Figure 22:
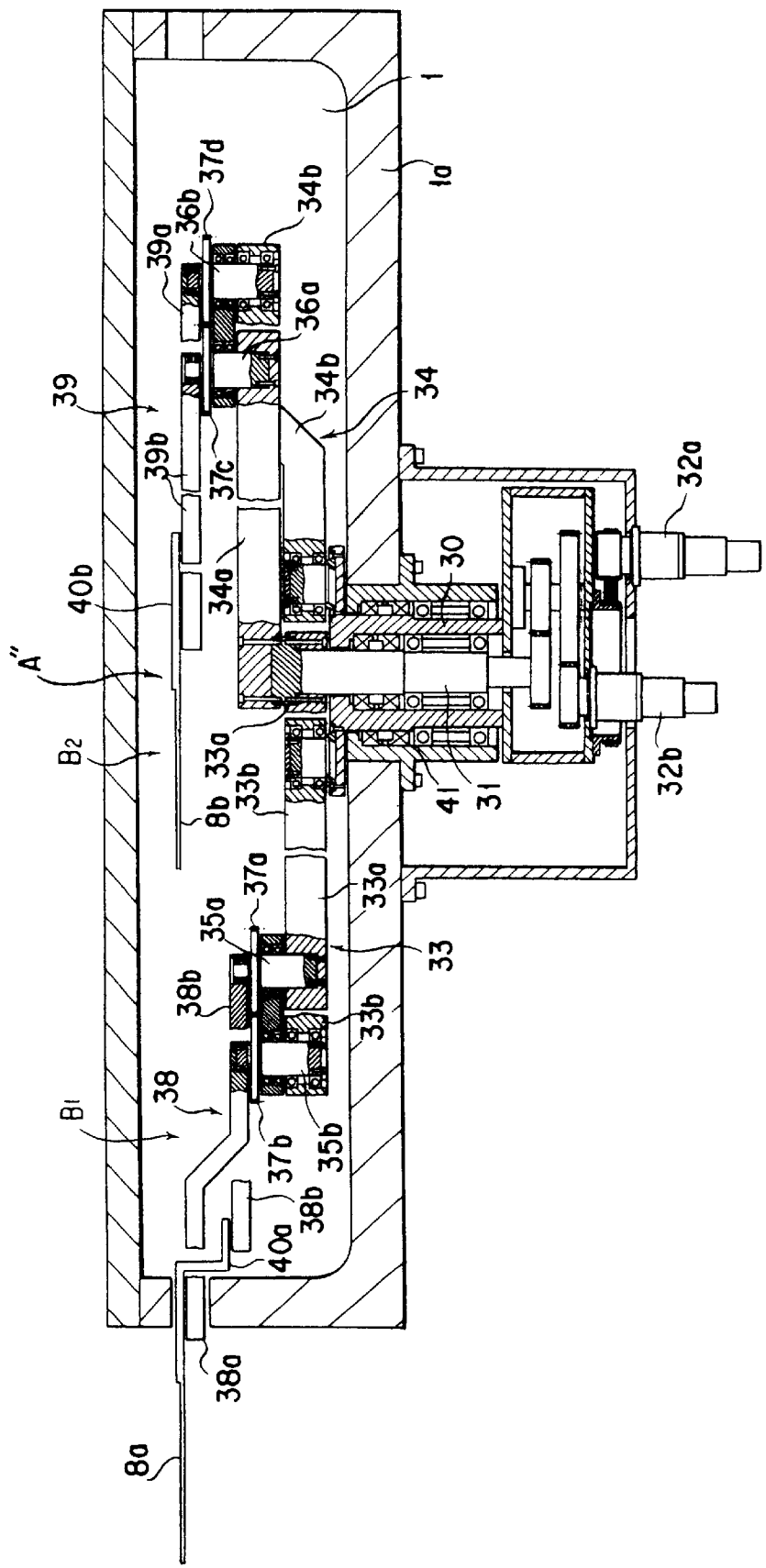
FIG. 22 is a cross sectional view that shows the construction of the third type of handling robot.

While in describing the illustrated form of embodiment of the invention, use is made of the second type of handling robot A', it should be understood that other types of handling robot including the third type of handling robot shown and indicated by A" in FIG. 20 are likewise applicable to the present invention. Also in FIGS. 24A and 24B, the paths traced by the carrier tables 8a and 8b to move from the position t03 to the position t04 and from the position t03' to the position t04' may simply intersect with the turning paths of the two carrier tables 8a and 8b in their standby state, or alternatively may tangentially contact with, intersect with and remove from the turning paths.

While the present invention has hereinbefore been set forth with respect to certain illustrative embodiments thereof, it will readily be appreciated by a person skilled in the art to be obvious that many alterations thereof, omissions therefrom and additions thereto can be made without departing from the essence and the scope of the present invention. Accordingly, it should be understood that the invention is not intended to be limited to the specific embodiments thereof set out above, but to include all possible embodiments thereof that can be made within the scope with respect to the features specifically set forth in the appended claims and encompasses all the equivalents thereof.

What is claimed is:

1. A handling robot control method for handling robot disposed in a transfer chamber having a plurality of process chamber stations arranged around it through partition walls in communication therewith via respective gates formed to the respective partition walls, the robot having a first and a second carrier table that are deviated in angular direction from one to the other about a center of turning of the robot and mechanically interlocked with each other, the robot having a drive means to turn and project or retract said first and second carrier tables via arms, said drive means performing an operation to move said first and second carrier tables to turn jointly and simultaneously in the transfer chamber and also an operation to move one of said first and second carrier tables to project through said gate into a said process chamber station and the other of said first and second carrier tables to retract into said transfer chamber simultaneously, the method comprising at least one of the steps of:

projecting one of said first and second carrier tables from within a turning path in respective standby states to the turning path and retracting the other of said first and second carrier tables from the process chamber station into the transfer chamber so as to bring it back to the turning path while turning said first and second carrier tables jointly; and projecting one of said first and second carrier tables from the turning path into the process chamber station and retracting the other of said first and second carrier tables from the turning path to within the turning path while turning said first and second carrier tables jointly, wherein a locus of each of said first and second carrier tables comprises curves each forming a shortcut.

2. A handling robot control method as set forth in claim 1, further comprising a step of further projecting one of said first and second carrier tables into the process chamber station and thereafter returning it and further retracting the other of said first and second carrier tables within the turning path and thereafter returning it.

3. A handling robot control method as set forth in claim 1 having speeds at which and distances by which said first and second tables move to project and retract on their way of turning are relatively determined in relation to their turning speed and the size of said gate, respectively, so that said first and second carrier tables do not interfere with said gate.

4. A handling robot control method for a handling robot disposed in a transfer chamber having a plurality of process chamber stations arranged around it through partition walls in communication therewith via respective gates formed to the respective partition walls, the robot having a first and a second carrier table that are deviated in angular direction from one to the other about a center of turning of the robot and mechanically interlocked each other, the robot having a drive means to turn and project or retract said first and second carrier tables via arms, said drive means performing an operation to move said first and second carrier tables to turn jointly and simultaneously in the transfer chamber and also an operation to move one of said first and second carrier tables to project through a said gate into a said process chamber station and the other of said first and second carrier tables to retract into said transfer chamber simultaneously, the method comprising the steps of:

projecting said second carrier table from a turning path in a standby state into the process chamber station and retracting said first carrier table from a turning path in a standby state to within the turning path while turning said first and second carrier tables jointly;

further projecting said second carrier table into the process chamber station and further retracting said first carrier table within the turning path;

returning said second carrier table to the side of the transfer chamber and returning said first carrier table to the side of the turning path;

projecting said first carrier table from the turning path into the process chamber station and retracting said second carrier table from the turning path to within the turning path while turning said first and second carrier tables jointly;

further projecting said first carrier table into the process chamber station and further retracting said second carrier table within the turning path;

returning said first carrier table to the side of the transfer chamber and returning said second carrier table to the side of the turning path; and projecting said second carrier table from within the turning path to the turning path and retracting said first carrier table from the process chamber station into the transfer chamber so as to bring it back to the turning path while turning said first and second carrier tables jointly, wherein a locus of each of said first and second carrier tables comprises curves each forming a shortcut.

* * * * *